United States Patent
Luo et al.

(10) Patent No.: US 7,245,496 B1
(45) Date of Patent: Jul. 17, 2007

(54) CIRCUIT BOARD FIXER STRUCTURE

(75) Inventors: Zi-Gui Luo, Taipei (TW); Eva Ma, Taipei (TW); Bg Fan, Taipei (TW)

(73) Assignee: Inventec Corporation (TW)

( * ) Notice: Subject to any disclaimer, the term of this patent is extended or adjusted under 35 U.S.C. 154(b) by 0 days.

(21) Appl. No.: 11/385,353

(22) Filed: Mar. 20, 2006

(51) Int. Cl.
*H05K 7/14* (2006.01)

(52) U.S. Cl. ............. 361/742; 361/804; 361/807; 361/758; 361/770

(58) Field of Classification Search ........ 361/742, 361/758, 770, 804, 752, 807, 809
See application file for complete search history.

(56) References Cited

U.S. PATENT DOCUMENTS

| | | | | |
|---|---|---|---|---|
| 3,029,486 A | * | 4/1962 | Raymond | 411/509 |
| 3,688,635 A | * | 9/1972 | Fegen | 174/138 A |
| 4,167,772 A | * | 9/1979 | Baehne | 361/758 |
| 4,200,900 A | * | 4/1980 | McGeorge | 361/803 |
| D278,330 S | * | 4/1985 | Hill | D8/354 |
| 4,674,910 A | * | 6/1987 | Hayashi | 403/408.1 |
| D291,056 S | * | 7/1987 | Hill | D8/354 |
| D292,263 S | * | 10/1987 | Hill | D8/354 |
| 4,781,488 A | * | 11/1988 | Hayashi | 403/408.1 |
| 6,225,566 B1 | * | 5/2001 | Dienst | 174/138 E |
| 6,493,233 B1 | * | 12/2002 | De Lorenzo et al. | 361/752 |
| 6,695,629 B1 | * | 2/2004 | Mayer | 439/92 |

* cited by examiner

*Primary Examiner*—Dean A. Reichard
*Assistant Examiner*—Dameon E. Levi
(74) *Attorney, Agent, or Firm*—Peter F. Corless; Steven M. Jensen; Edwards Angell Palmer & Dodge LLP

(57) ABSTRACT

A circuit board fixer structure, for fixing a circuit board having at least one through hole, includes a carrier for carrying the circuit board, a pillar, and a stud. The pillar is mounted on the carrier and is formed with a first opening and a second opening corresponding to the first opening. The circuit board is fixed in place on the carrier by the pillar penetrating the through hole of the circuit board and the stud penetrating the first and second openings of the pillar to be coupled to the pillar. By the circuit board fixer structure, there is no need to use any tool to assemble and disassemble a circuit board in an electronic device, making the assembly and disassembly of the circuit board convenient to implement.

12 Claims, 4 Drawing Sheets

CIRCUIT BOARD FIXER STRUCTURE

FIELD OF THE INVENTION

The present invention relates to circuit board fixer structures, and more particularly, to a fixer structure for a circuit board of an electronic device.

BACKGROUND OF THE INVENTION

As the technology advances, electronic devices such as desktop computers, laptop computers and servers have played an important role in the daily life. Each electronic device is provided with a circuit board (or a motherboard) that is fixed to a housing of the electronic device. Various ways for fixing the circuit board to the electronic device are available and cause different effects on the circuit board.

FIG. 1A is a top view of a conventional circuit board 12 mounted on a housing 13 of an electronic device, and FIG. 1B is a front view of the structure shown in FIG. 1A. As shown in FIGS. 1A and 1B, the housing 13 of the electronic device is formed with a plurality of carrier pads 131 thereon, wherein each of the carrier pads 131 has a blind hole 1311. The circuit board 12 has a plurality of openings 121 corresponding to the blind holes 1311 of the carrier pads 131 and is placed on the carrier pads 131. The circuit board 12 is fixed to the housing 13 of the electronic device by a plurality of coupling members 11 such as screws inserted into the openings 121 and the blind holes 1311.

To fix the above circuit board 12 to the housing 13 of the electronic device needs a screwdriver or a similar tool to screw the coupling members 11, which is rather troublesome and time-consuming to implement. If a force for screwing the coupling members 11 is not properly controlled, the circuit board 12 may be damaged by the coupling members 11. Moreover, since the coupling members 11 are often made of a metallic material having electrical conductivity, they may cause signal interference to the circuit board 12, thereby adversely affecting the performance of the circuit board 12.

Thus, Taiwanese Patent No. 00510512 proposes a computer with a screw-free motherboard. Referring to FIG. 2A, the computer with a screw-free motherboard comprises a housing 23, a block 24 and a pillar 21 that are formed on the housing 23, and a circuit board 22. When mounting the circuit board 22 on the housing 23, a wide portion 2211 of a mounting hole 221 of the circuit board 22 is put around a protruding portion 211 of the pillar 21 to reach a neck portion 212 of the pillar 21, and then the circuit board 22 is moved in a direction indicated by arrow A (as show in FIG. 2B) to allow the neck portion 212 of the pillar 21 to be engaged with a narrow portion 2212 of the mounting hole 221 of the circuit board 22, such that a terminal 222 of the circuit board 22 is blocked by the block 24 on the housing 23, so as to firmly fix the circuit board 22 on the housing 23, without using any screw to position the circuit board 22.

However, the above computer with a screw-free motherboard requires provision of the block 24 on the housing 23. The block 24 is an elastic hollow structure and can be deformed if being pressed by the circuit board 22, such that the positioning effect of the circuit board 22 is affected by the elastic deformation of the block 24. Moreover, the above design requires formation of the mounting hole 221 having the wide portion 2211 and the narrow portion 2212 for the circuit board 22, thereby undesirably increasing the fabrication cost.

Therefore, the problem to be solved here is to provide a circuit board fixer structure to overcome the foregoing drawbacks of the prior art.

SUMMARY OF THE INVENTION

In light of the foregoing drawbacks of the prior art, an objective of the present invention is to provide a circuit board fixer structure, which allows assembly and disassembly between the fixer structure and a circuit board to be easily and quickly performed.

Another objective of the present invention is to provide a circuit board fixer structure, which allows assembly and disassembly between the fixer structure and a circuit board to be performed without any tool.

Still another objective of the present invention is to provide a circuit board fixer structure without causing signal interference to a circuit board.

A further objective of the present invention is to provide a circuit board fixer structure, which can be produced in a batch-type and cost-effective manner.

In order to achieve the foregoing and other objectives, the present invention proposes a circuit board fixer structure for fixing a circuit board having at least one through hole. The circuit board fixer structure comprises: a carrier for carrying the circuit board; a pillar mounted on the carrier and being formed with a first opening and a second opening corresponding to the first opening; a stud for penetrating the first and second openings of the pillar to be coupled to the pillar provided that the pillar penetrates the through hole of the circuit board, so as to fix the circuit board in place on the carrier.

The first and second openings of the pillar can have a round or oval shape. The size of the first opening can be smaller than, equal to, or larger than the size of the second opening. The pillar is made of a plastic material.

The stud can be a cylinder or a cone, and is made of a plastic material. The stud has a handler portion for a user to easily assemble and disassemble the stud to and from the pillar. The handler portion can be a ring, a block, a wire, or an embossed and roughed surface formed on one end of the stud. One side of the stud can abut against a surface of the circuit board or can be spaced from the surface of the circuit board by a certain distance.

Therefore, the circuit board fixer structure of the present invention can solve the problems in the prior art such as inconvenient and time-consuming assembly and disassembly of a circuit board in an electronic device due to the use of screws to fix the circuit board in place.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Preferred embodiments of a circuit board fixer structure proposed in the present invention are described as follows with reference to FIGS. 3 to 5. It is to be noted that the drawings are simplified schematic diagrams and only show components relating to the present invention. In practice, the layout of components could be more complicated. It should be understood that the following embodiments are not construed to limit the scope of the present invention.

Figure 1A:
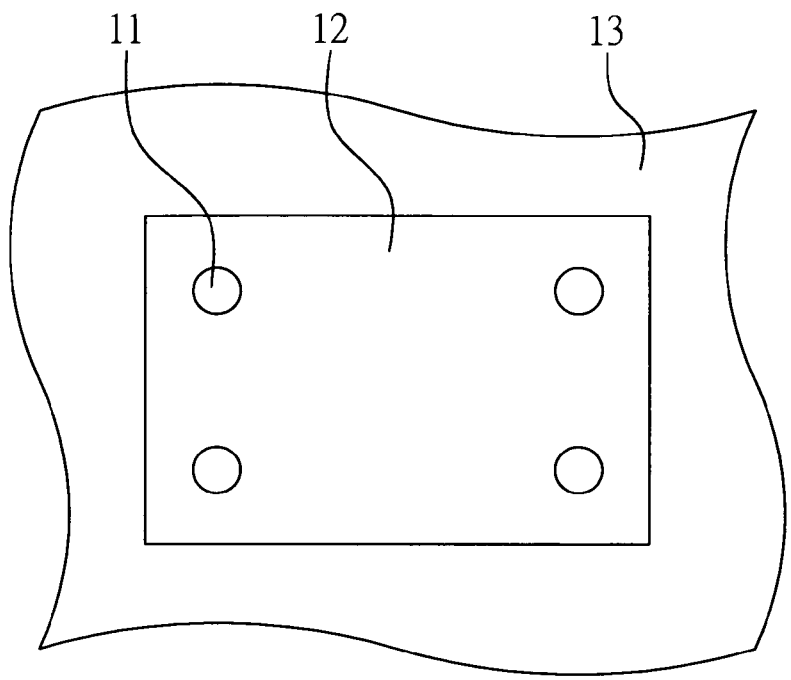
FIG. 1A (PRIOR ART) is a top view showing a conventional circuit board mounted on a housing of an electronic device.
Figure 1B:
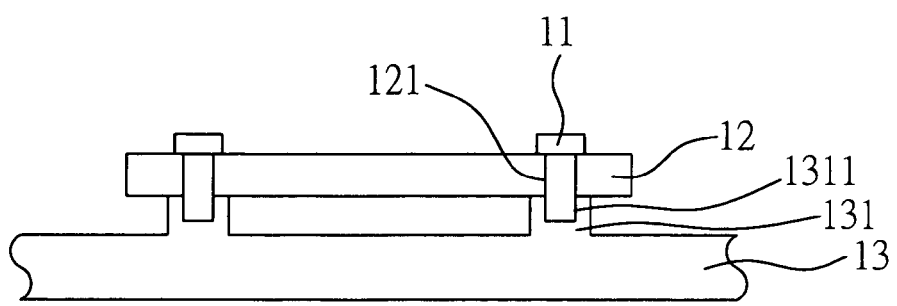
FIG. 1B (PRIOR ART) is a front view of the structure shown in FIG. 1A.
Figure 2A:
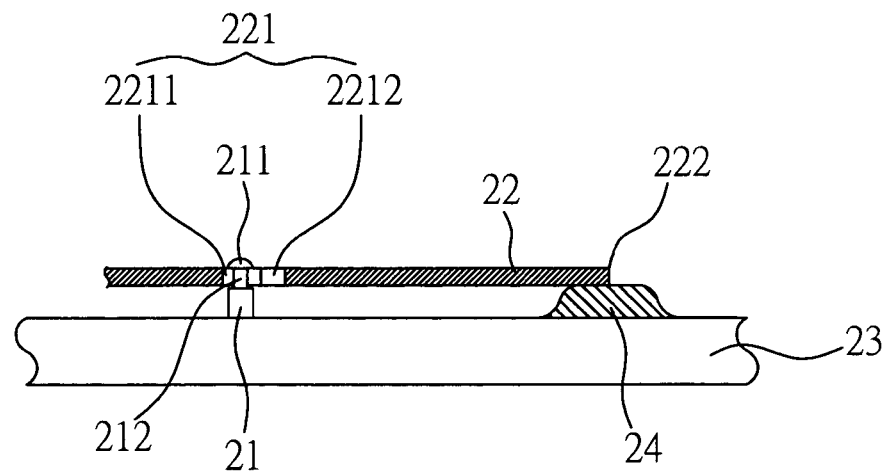
FIG. 2A (PRIOR ART) is a schematic diagram showing another conventional circuit board mounted on a housing of an electronic device.
Figure 2B:
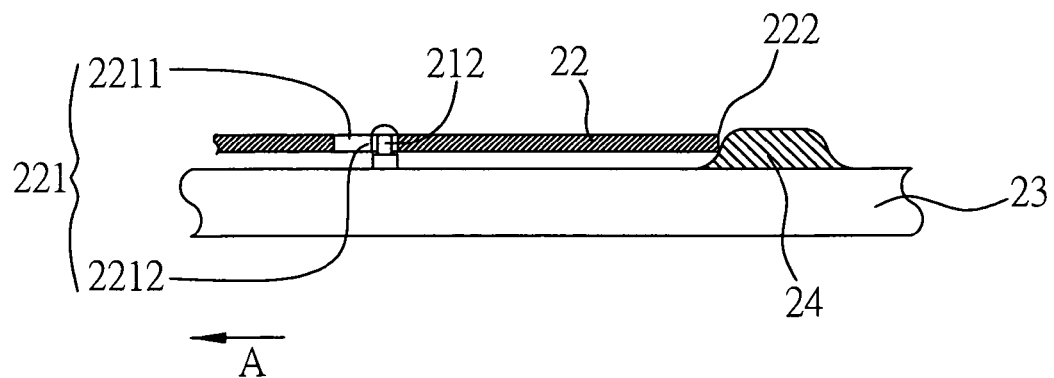
FIG. 2B (PRIOR ART) is a schematic diagram showing an action of the circuit board being fixed on the housing of the electronic device of FIG. 2A.
Figure 3A:
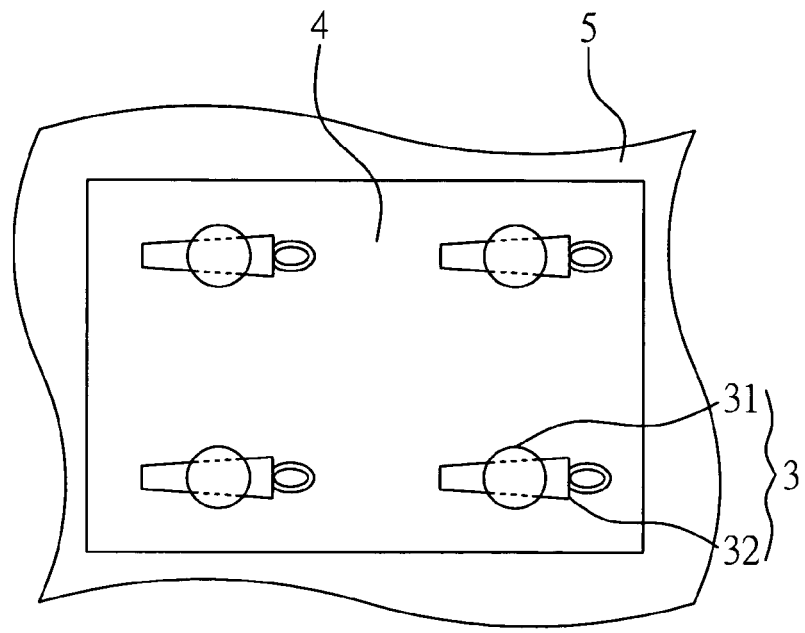
FIG. 3A is a schematic diagram showing a circuit board fixer structure being applied to a circuit board of an electronic device in accordance with a first preferred embodiment of the present invention.
Figure 3B:
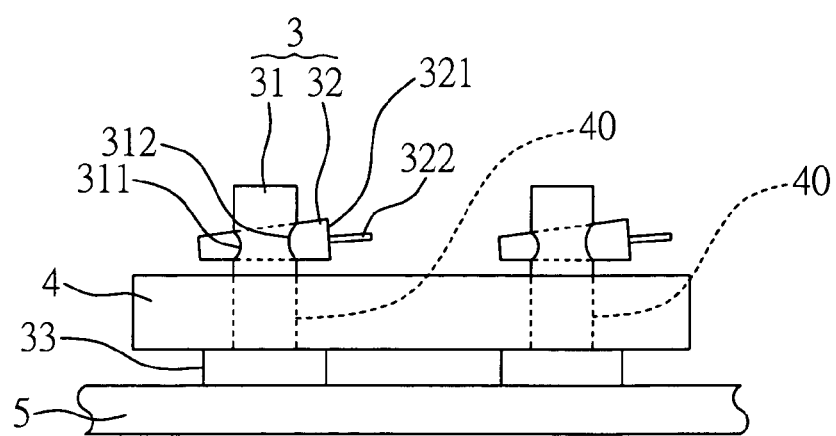
FIG. 3B is a front view of the structure shown in FIG. 3A.

FIGS. 3A and 3B illustrate a circuit board fixer structure 3 according to a first preferred embodiment of the present invention for use with a circuit board 4. As shown in FIGS. 3A and 3B, the circuit board 4 is formed with a plurality of through holes 40, and the circuit board fixer structure 3 comprises: a carrier 5 for carrying the circuit board 4, a pillar 31 and a stud 32.

The pillar 31 includes a pad 33 mounted on the carrier 5 and for carrying the circuit board 4. The pillar 31 further includes a first opening 311 and a second opening 312 corresponding to the first opening 311, which are formed in a horizontal direction and can accommodate the stud 32, wherein the first opening 311 is smaller in size than the second opening 312. The pillar 31 is made of a plastic material and is formed by injection molding, which thus can be produced in a batch-type manner.

The stud 32 is a cone having the shape to be accommodated in the first and second openings 311, 312 with the first opening 311 being smaller in size than the second opening 312. When the pillar 31 penetrates one of the through holes 40 of the circuit board 4, the stud 32 penetrates the first opening 311 and the second opening 312 of the pillar 31 to be coupled to the pillar 31, so as to fix the circuit board 4 in place on the carrier 5.

The stud 32 further comprises a handler portion 322 for a user to easily assemble and disassemble the stud 32 to and from the pillar 31. The handler portion 322 is a ring mounted on one end 321 of the stud 32, and can be formed integrally with the stud 32. When the user wishes to mount or detach the circuit board 4 on or from the carrier 5, he or she only needs to hold the handler portion 322 to insert or pull the stud 32 into or from the first and second openings 311, 312 of the pillar 31. This allows assembly and disassembly of the circuit board 4 to and from the carrier 5 to be quickly and conveniently performed.

Besides, in this embodiment, the first and second openings of the pillar can have a round or oval shape, and the size of the first opening can be larger than the size of the second opening. These modifications are understandable for a person skilled in the art and thus are not further to be illustrated by drawings.

Figure 4:
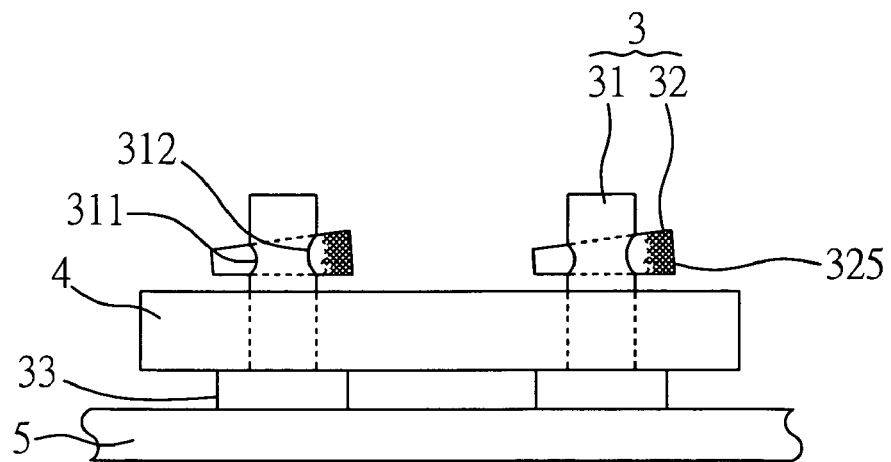
FIG. 4 is a schematic diagram of the circuit board fixer structure in accordance with a second preferred embodiment of the present invention.

FIG. 4 shows the circuit board fixer structure 3 according to a second preferred embodiment of the present invention, wherein same or similar elements as compared with those of the first embodiment are denoted by same or similar reference numerals and are not further to be described in detail for the sake of brevity.

A primary difference of the circuit board fixer structure 3 of the second embodiment as compared with that of the first embodiment is in that, the end of the stud 32 is formed with an embossed surface 325 to replace and serve as the handler portion 322 of the first embodiment, so as to reduce the material and the cost. The embossed surface 325 provides the same effect as the handler portion 322 of the first embodiment, for the user to hold the embossed surface 325 to assemble and disassemble the stud 32 to and from the pillar 31.

Figure 5:
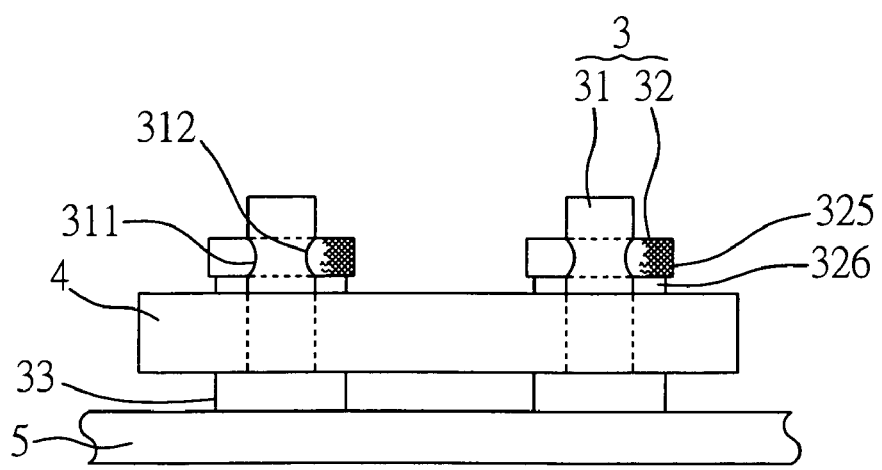
FIG. 5 is a schematic diagram of the circuit board fixer structure in accordance with a third preferred embodiment of the present invention.

FIG. 5 shows the circuit board fixer structure 3 according to a third preferred embodiment of the present invention, wherein same or similar elements as compared with those of the second embodiment are denoted by same or similar reference numerals and are not further to be described in detail for the sake of brevity.

A primary difference of the circuit board fixer structure 3 of the third embodiment as compared with that of the second embodiment is in that, the size of the first opening 311 is equal to that of the second opening 312 of the pillar 31, and the stud 32 is a cylinder to conform to such arrangement of the pillar 31. Moreover, a buffer ring 326 is provided between the stud 32 and the circuit board 4 to increase the friction of the stud 32 and avoid the stud 32 coming off, such that the stud 32 can be secured in position by means of the buffer ring 326. The buffer ring 326 can further absorb external shocks exerted to the circuit board 4, and is made of rubber.

Therefore, the circuit board fixer structure of the present invention allows quick and easy assembly and disassembly of the circuit board to and from the carrier. Since the circuit board fixer structure is primarily made of a plastic material, it is cost-effective to fabricate. Moreover, the circuit board fixer structure of the present invention solves the problems in the prior art such as signal interference, and inconvenient and time-consuming assembly and disassembly of a circuit board in an electronic device, caused by the use of screws to fix the circuit board in place.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A circuit board fixer structure for fixing a circuit board having at least one through hole, comprising:
    a carrier for carrying the circuit board thereon;
    a pillar mounted on the carrier, and being formed with a first opening and a second opening corresponding to the first opening, wherein a line passing through the first opening and the second opening is parallel to the horizontal plane of the carrier; and
    a stud penetrating the first and second openings of the pillar when the pillar penetrates the through hole of the circuit board, so as to fix the circuit board in place on the carrier.

2. The circuit board fixer structure of claim 1, wherein the first and second openings have one of a round shape and an oval shape.

3. The circuit board fixer structure of claim 1, wherein the first opening is smaller in size than the second opening.

4. The circuit board fixer structure of claim 1, wherein the first opening is equal in size to the second opening.

5. The circuit board fixer structure of claim 1, wherein the first opening is larger in size than the second opening.

6. The circuit board fixer structure of claim 1, wherein the stud is one of a cylinder and a cone.

7. The circuit board fixer structure of claim 1, wherein the stud further comprises a handler portion for facilitating assembly and disassembly of the stud to and from the pillar.

8. The circuit board fixer structure of claim 7, wherein the handler portion is one of a ring and a block.

9. The circuit board fixer structure of claim 7, wherein one end of the stud is formed with an embossed surface that acts as the handler portion.

10. The circuit board fixer structure of claim 1, wherein the pillar and the stud are made of a plastic material.

11. The circuit board fixer structure of claim 1, further comprising a buffer ring provided between the stud and the circuit board to increase a friction of the stud.

12. The circuit board fixer structure of claim 11, wherein the buffer ring is made of rubber.

\* \* \* \* \*